(12) United States Patent
Rahman et al.

(10) Patent No.: US 7,899,431 B2
(45) Date of Patent: Mar. 1, 2011

(54) DC OFFSET CORRECTION SYSTEM FOR A RECEIVER WITH BASEBAND GAIN CONTROL

(75) Inventors: Mahibur Rahman, Lake Worth, FL (US); Manish N. Shah, Vernon Hills, IL (US); Charles L. Sobchak, Davie, FL (US)

(73) Assignee: Freescale Semiconductor, Inc., Austin, TX (US)

( * ) Notice: Subject to any disclaimer, the term of this patent is extended or adjusted under 35 U.S.C. 154(b) by 1614 days.

(21) Appl. No.: 11/099,138

(22) Filed: Apr. 4, 2005

(65) Prior Publication Data

US 2006/0222117 A1    Oct. 5, 2006

(51) Int. Cl.
    *H04B 1/26* (2006.01)
(52) U.S. Cl. ................ 455/324; 455/232.1; 455/296
(58) Field of Classification Search ........... 455/324
    See application file for complete search history.

(56) References Cited

U.S. PATENT DOCUMENTS

| | | | |
|---|---|---|---|
| 5,212,826 A * | 5/1993 | Rabe et al. ............ | 455/214 |
| 5,689,815 A | 11/1997 | Yamazaki et al. | |
| 6,240,100 B1 * | 5/2001 | Riordan et al. ............ | 370/442 |
| 6,459,889 B1 * | 10/2002 | Ruelke ............ | 455/296 |
| 6,560,447 B2 * | 5/2003 | Rahman et al. ............ | 455/232.1 |
| 6,606,359 B1 | 8/2003 | Nag et al. | |
| 6,717,995 B2 | 4/2004 | Zvonar | |
| 6,735,422 B1 | 5/2004 | Baldwin et al. | |
| 6,753,727 B2 | 6/2004 | Magoon et al. | |
| 2002/0151289 A1 | 10/2002 | Rahman et al. | |
| 2004/0081256 A1 | 4/2004 | Shi et al. | |
| 2004/0097212 A1 | 5/2004 | Matsumoto et al. | |
| 2004/0119531 A1 | 6/2004 | Shen et al. | |
| 2004/0121735 A1 | 6/2004 | Tseng et al. | |
| 2004/0121741 A1 | 6/2004 | Rashev et al. | |
| 2004/0121746 A1 | 6/2004 | Akamine et al. | |
| 2004/0146128 A1 | 7/2004 | Cuje et al. | |

FOREIGN PATENT DOCUMENTS

JP    2005020119    1/2005

* cited by examiner

*Primary Examiner*—Duc Nguyen
*Assistant Examiner*—Ajibola Akinyemi
(74) *Attorney, Agent, or Firm*—Ingrassia Fisher & Lorenz, P.C.

(57) ABSTRACT

A method and apparatus are provided for providing improved radio frequency (RF) receiver signal correction. For RF receiver circuitry (106) having receive path and a warmup period associated therewith and including at least one analog baseband gain control stage (218) having a gain associated therewith, the method includes the step of performing a DC correction calculation operation during the warmup period to derive a DC correction value having a first component and a second component for each of the at least one gain control stage (218). The DC correction calculation step includes the steps of performing a first closed loop correction (460) of a baseband path to derive the first component of the DC correction value and performing a second closed loop correction (462) of the receive path as a function of the (218) gain during the warmup period to derive the second component of the DC correction value. During operation after the warmup period (464, 466), an open loop correction is performed for instantaneous DC correction as function of the PMA (218) gain and the DC correction value.

17 Claims, 7 Drawing Sheets

FIG. 8

DC OFFSET CORRECTION SYSTEM FOR A RECEIVER WITH BASEBAND GAIN CONTROL

FIELD OF THE INVENTION

The present invention generally relates to radio frequency (RF) receivers, and more particularly relates to DC offset correction in a receiver with baseband gain control.

BACKGROUND OF THE INVENTION

Baseband direct current (DC) offset correction is commonly used in zero intermediate frequency (ZIF) and very low intermediate frequency (VLIF) receivers to eliminate offsets due to local oscillator leakage, filter flicker noise, and circuit mismatches. This correction is necessary to avoid clipping effects within the baseband analog signal path as well as to meet the desired receiver performance under weaker signal conditions (e.g., receiver sensitivity). Baseband gain control with large coarse steps can be employed in a receiver to achieve the necessary receiver dynamic range at a low cost and current drain while minimizing the amount of RF gain control range required. However, in continuous data reception (i.e., non-time division multiplexed) receivers such as that for wideband code-division multiple access (WCDMA) receivers, there needs to be a mechanism to quickly and accurately compensate for large DC offset steps which occur as a result of large baseband gain steps. If this is not achieved, receiver performance degradation can occur due to long DC and clipping transients. The large baseband gain changes can occur not only due to a larger step size of the baseband gain control stage but also due to RF Low Noise Amplifier (LNA) gain replacements within the baseband gain control stage. The RF LNA gain replacement is necessary to avoid applying large gain steps at the input to the baseband filters as well as to maintain a constant signal level into the received signal detector. In addition, RF standards such as High Speed Downlink Packet Access (HSDPA), a packet-based data service 3.5 G WCDMA standard, expect a large constant signal-to-noise ratio at the receiver analog-to-digital input where this is also necessary.

Accordingly it is desirable to provide a method and apparatus for DC offset correction which quickly and accurately compensates for large DC offset steps which occur as a result of large baseband gain steps while maintaining a constant signal-to-noise ratio at the receiver analog-to-digital input. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
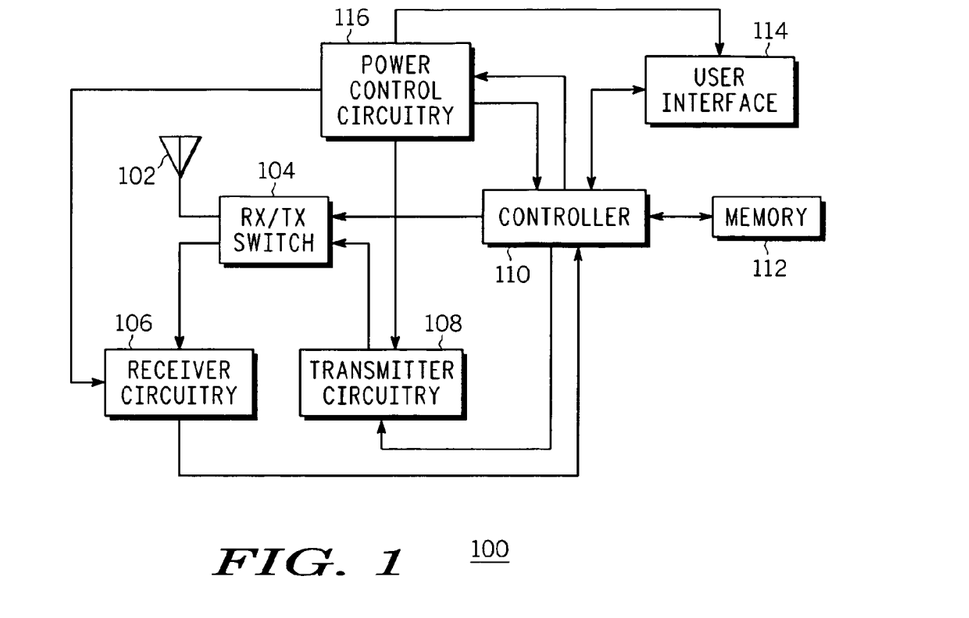
FIG. 1 is a block diagram of an electronic communication device in accordance with a preferred embodiment of the present invention.

Referring to FIG. 1, a block diagram of an electronic communication device 100, such as a cellular telephone, is shown. Although the electronic communication device 100 is depicted as a cellular telephone, the electronic communication device can be implemented as a pager, a laptop computer with a wireless connection, a personal digital assistant with wireless connection, or the like. The electronic communication device 100 includes an antenna 102 for receiving and transmitting radio frequency (RF) signals. A receive/transmit switch 104 selectively couples the antenna 102 to receiver circuitry 106 and transmitter circuitry 108 in a manner familiar to those skilled in the art. The receiver circuitry 106 demodulates and decodes the RF signals to derive information and is coupled to a controller 110 for providing the decoded information thereto for utilization thereby in accordance with the function(s) of the electronic communication device 100.

The controller 110 also provides information to the transmitter circuitry 108 for encoding and modulating information into RF signals for transmission from the antenna 102. As is well-known in the art, the controller 110 is typically coupled to a memory device 112 and a user interface 114 to perform the functions of the electronic communication device 100. Power control circuitry 116 is coupled to the components of the electronic communication device 100, such as the controller 110, the receiver circuitry 106, the transmitter circuitry 108 and/or the user interface 114, to provide appropriate operational voltage and current to those components. The user interface 114 may include one or more user interface devices such as a microphone, a speaker, key inputs, such as a keypad and a display for displaying information to a user and which may also accept touch screen inputs.

Figure 2:
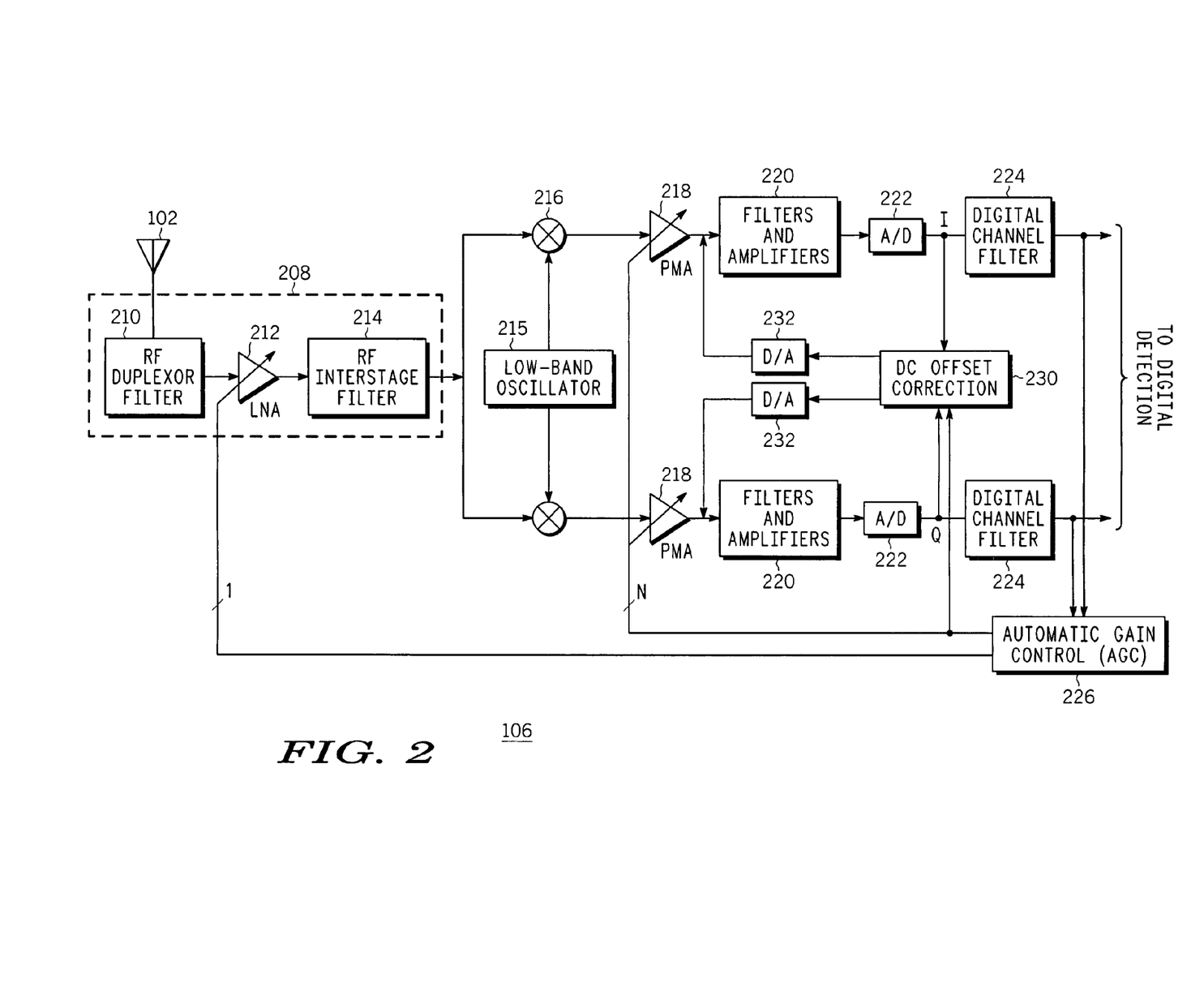
FIG. 2 is a block diagram of a radio frequency receiver of the electronic communication device of FIG. 1 in accordance with a preferred embodiment of the present invention.

Referring to FIG. 2, a high level block diagram of a low cost and low power RF receiver 106 in accordance with the present invention has a receive path as shown and includes an RF frontend section 208. In accordance with the preferred embodiment of the present invention, the RF receiver 106 is optimized for RF standards such as High Speed Downlink Packet Access (HSDPA), a packet-based data service 3.5 G WCDMA standard, which require maintaining a constant signal level into the received signal detector as well as a large constant signal-to-noise ratio at the receiver analog-to-digital input.

The RF frontend section 208 of the receiver 106 includes an RF duplexor filter 210, a stepped Low Noise Amplifier (LNA) amplifier 212 and an RF band select filter 214. The RF frontend section 208 amplifies the RF signal from the antenna 102 (FIG. 1) and selects the desired RF frequency band. The receive/transmit switch 104 (FIG. 1) and the RF front end section 208 and any other blocks located prior to the quadrature mixers 216 (such as switches, LNAs 212, filters or other attenuator stages) form a pre-mixer RF lineup which can have a low gain state or a high gain state by adjusting the LNA 212 to a low gain state or a high gain state, or by adjusting the gain state at the receive/transmit switch 104 or by adjusting other parameters within the pre-mixer RF lineup.

Following the RF frontend section 208, I/Q quadrature mixers 216 for each of the two quadrature paths (the imaginary (I) path and the quadrature (Q) path) are employed to convert the RF signal to a low or zero Intermediate Frequency (zero IF) by mixing the received signal with the output of a lowband oscillator (LO) 215. Next, a baseband analog gain control stage such as a high dynamic range Post Mixer Amplifier (PMA) 218 is used to provide much of the desired receiver dynamic range to minimize the cost and the power consumption of the RF receiver 106. This can be accomplished by using a stepped PMA stage 218 using coarse steps such as three decibels (dB) over a large control range (e.g., forty-five dB). After the PMA stage 218, active analog filter stages 220 are used to provide the necessary clipping protection against interferers and also to provide anti-aliasing protection for the analog-to-digital (A/D) converters 222. Digital filters 224 provide the necessary channel filtering and droop/group delay compensation. The PMA 218, filters 220, A/D converters 222 and digital filters 224 form a baseband path.

An automatic gain control (AGC) 226 dynamically controls the stepped LNA and PMA stages. The AGC 226 is programmed to maintain a desired operating range throughout the receiver 106 in a manner such as to avoid over-driving or under-driving any component thereof. In accordance with the present invention, the DC offset detection and correction 230 is performed digitally in a DC correction feedback path after the I and Q path A/D converters 222. The correction values are applied through D/A converters 232 to the outputs of the PMAs 218. Performing the DC correction method 230 digitally advantageously allows for higher performance (e.g., correction accuracy, loop stability, etc.) and lower cost and lower power implementations.

Unfortunately, large baseband gain steps in the PMA 218 due to LNA 212 gain replacement applied to the PMA 218 (e.g., sixteen dB step) and coarse PMA 218 steps (e.g., three dB steps) leads to large and long DC transients in the receiver baseband receive signal path. This phenomenon occurs due to the offsets related to the LO 215 leakage, the mixer 216 and the PMA 218 being proportionately scaled by the indicated large baseband gain changes. The specified DC transients can cause clipping in the baseband stages as well as degrade the receiver 106 Bit Error Rate performance for the duration of such transients. In addition, these large DC transients can cause non-linear behavior in baseband circuits with feedback (e.g., active filter stages and sigma delta A/D's). Also, in many receivers 106 such as that for High Speed Downlink Packet Access (HSDPA), a packet-based data service 3.5 G WCDMA standard operating at 16-QAM/64-QAM modulation, the DC notch (i.e, high pass filter corner) due to the closed loop DC offset correction system must be kept low (<<1 KHz) to not degrade the 0.1% Bit Error Rate receiver sensitivity performance. Hence, widening of this DC notch to compensate for the large baseband gain changes is not acceptable.

In accordance with the present invention, the baseband DC offset correction system architecture and digital correction algorithm 230 overcomes the difficulties of prior art correction systems by employing a two step calibration procedure which is performed during the receiver warmup process. This mixed signal control algorithm is able to quickly and accurately compensate for large DC offset steps which occur as a result of large baseband gain changes.

Figure 3:
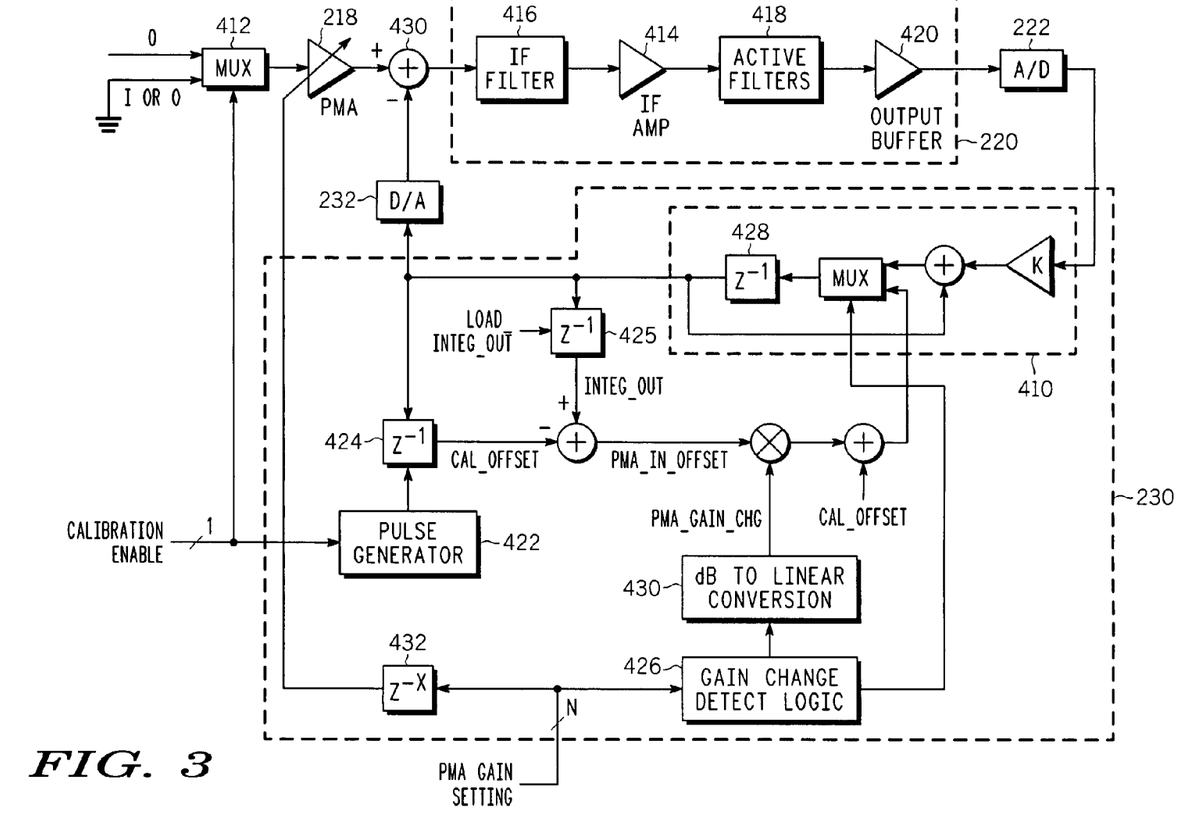
FIG. 3 is a block diagram of a single quadrature channel of the radio frequency receiver of FIG. 2 in accordance with a preferred embodiment of the present invention.

Referring to FIG. 3, a block diagram of the details of the invention depict a single quadrature channel (I or Q) in accordance with the present invention and includes a DC offset correction system which allows for dynamic immediate compensation for large DC offset steps introduced due to large baseband gain changes. Long DC transients that can otherwise occur due to large baseband PMA gain changes from either LNA gain replacements in the PMA stage or coarse PMA steps taken can be avoided. This dynamic open loop correction is achieved instantaneously in a manner such as to avoid any DC transients while the closed loop system is maintained in a held state. A typical mixed signal DC offset correction system architecture is described in U.S. Pat. No. 6,560,447. The present invention includes additional elements as described herein. Following the 1-or multibit A/D converter 222, the feedback loop includes a digital loop filter 410 which is typically implemented using a leaky integrator first order loop filter structure. The closed loop bandwidth is set by appropriately setting the gain (K) of the loop filter 410. Following the loop integrator 410, the DC correction D/A converter 232 applies the correction value at the PMA 218 output in a closed loop fashion.

During the first step of the DC offset correction warmup sequence, the "DC Calibration Step 1 Enable" signal is set high to short to ground the input of the PMA. This allows the DC correction algorithm to calibrate out only those offsets due to the elements located at and after the PMA stage 220 (e.g., PMA, IF amplifier 414, IF filter 416, biquads 418, output buffer 420, comparator, and DC correction DAC 232 stages) signaling the multiplexer 412 to couple the input of the PMA 218 to ground. At the end of this calibration step, the high to low transition of the indicated "DC Calibration Step 1 Enable" signal causes a load pulse 422 to be generated to load the acquired DC offset located at the loop filter 410 output into the cal_offset register 424. This acquired offset (cal_offset) 424 is then later used by the DC offset correction algorithm to dynamically only compensate for those offsets located at the PMA input whenever a large PMA gain change occurs to avoid any transients in the feedforward signal path.

Following the specified initial calibration step, the shorting to ground at the PMA 412 input is removed by signaling the multiplexer 412 to directly connect the mixer output to the PMA input. Subsequently, a second closed loop DC offset correction warmup step is performed to quickly calibrate out those additional offsets located at the PMA input due to LO 215 leakage as well as mixer 216 related static offsets. The result of this second closed loop correction step is loaded from the loop filter 410 into the integ_out register 425 at the completion of this second closed loop correction step. The load_integ_out signal generated by an external controller unit is used to load the integ_out register 425 when a pulse is present on this signal.

At the completion of the two-step warmup process of the present invention, the integrator 410 output will settle to a value which reflects:

integ_out=cal_offset+pma_in_offset where pma_in_offset reflects only those offsets located at the PMA 218 input due to the LO 215 leakage and mixer 216 stage offsets. As mentioned earlier, cal_offset reflects those other offsets located in the baseband signal except for those at the PMA 218 input. During receiver 106 data reception, when the PMA 218 gain is altered due to either LNA 212 gain replacements or coarse PMA 218 gain steps applied, a load pulse is generated from the PMA gain change detect logic 426. This is done to dynamically compensate for only those DC offsets located at the PMA 218 input to avoid DC transients by updating the current loop integrator register 428 content with:

integ_update=pma_gain_chg*(integ_out−cal_offset)+ cal_offset where integ_update reflects the new value that will be stored into the integration register 428 to compensate for the PMA 218 gain change. Also, pma_gain_chg is the detected PMA 218 gain change on a linear scale after dB to linear conversion at circuit 430. Substituting for integ_out based upon the previous equation, results in:

integ_update=pma_gain_chg*(cal_offset+pma_ in_offset−cal_offset)+cal_offset= (pma_gain_chg*pma_in_offset)+cal_offset Thus, based upon the above result, the circuit of the present invention advantageously only compensates for those offsets at the PMA 218 input using the detected PMA 218 gain change value and not for those offsets located after the PMA stage. Alternately, if integ_out (which also includes offsets due to stages after the PMA 218 at the completion of the second closed loop DC correction) had been scaled using the PMA 218 gain change amount, it would lead to additional DC transients in the feedforward signal path depending upon the amount of offsets located after the PMA 218 stage.

The delay element ($z^{-X}$) 432 shown on the PMA 218 control path is employed to time align the dynamic DC offset compensation applied at the DC correction D/A 232 output with the PMA 218 gain change application to avoid any DC transient that can otherwise occur due to timing misalignment of the indicated DC offset compensation at the output of the subtractor 430. In addition, the "dB to linear" conversion block 430 shown converts the PMA gain change value (which is typically on a dB scale) to a linear scale since the DC correction signal path operates on a linear scale. The digital DC correction signal is applied to the D/A converter 232 and thence to the DC correction subtractor 430 for application of the correction value to the signal.

Figure 4:
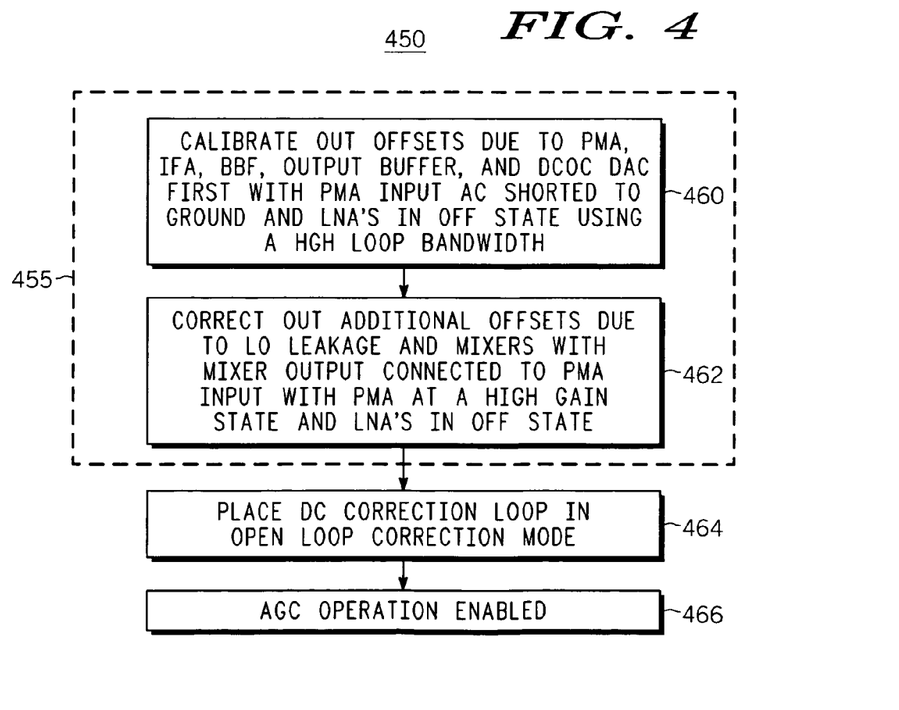
FIG. 4 is a flowchart of the operation of the DC offset correction warmup loop of the radio frequency receiver of FIG. 2 in accordance with the preferred embodiment of the present invention.

Referring to FIG. 4, the flow chart 450 summarizes how the two-step DC offset correction warmup process can be used as part of a practical receiver warmup process. Note that the LNA's 212 and the receive/transmit switch 104, when possible, are placed in a low gain state during the two-step DC offset correction warmup process 460, 462 to minimize the related warmup times since a strong on- or off-channel signal can degrade the acquisition performance of the closed loop system. During the first step of the warmup sequence 460, the input of the PMA is shorted to ground to perform a first closed loop calibration of the baseband path. During the second step of the warmup sequence 462, the PMA 218 input is directly connected to the mixer output and the PMA is placed in a high gain mode. A second closed loop calibration of the receive path is performed with these settings. Note that the high PMA gain setting maximizes the offsets located at the PMA 218 input into the A/D 222 input and this ensures the desired correction performance under receiver sensitivity conditions (where DC correction performance is most crucial).

After DC correction warmup 455, the closed loop DC offset correction system is placed in the open loop correction mode 464 and is held in that mode by placing the DC correction feedback path in a hold mode, holding the DC correction value in the register 428. During normal operation of the AGC system 466, an open loop correction method is employed to dynamically compensate for DC offset steps introduced by large baseband gain changes instantaneously by performing an open loop correction in response to altering of the PMA 218 gain.

Figure 5:
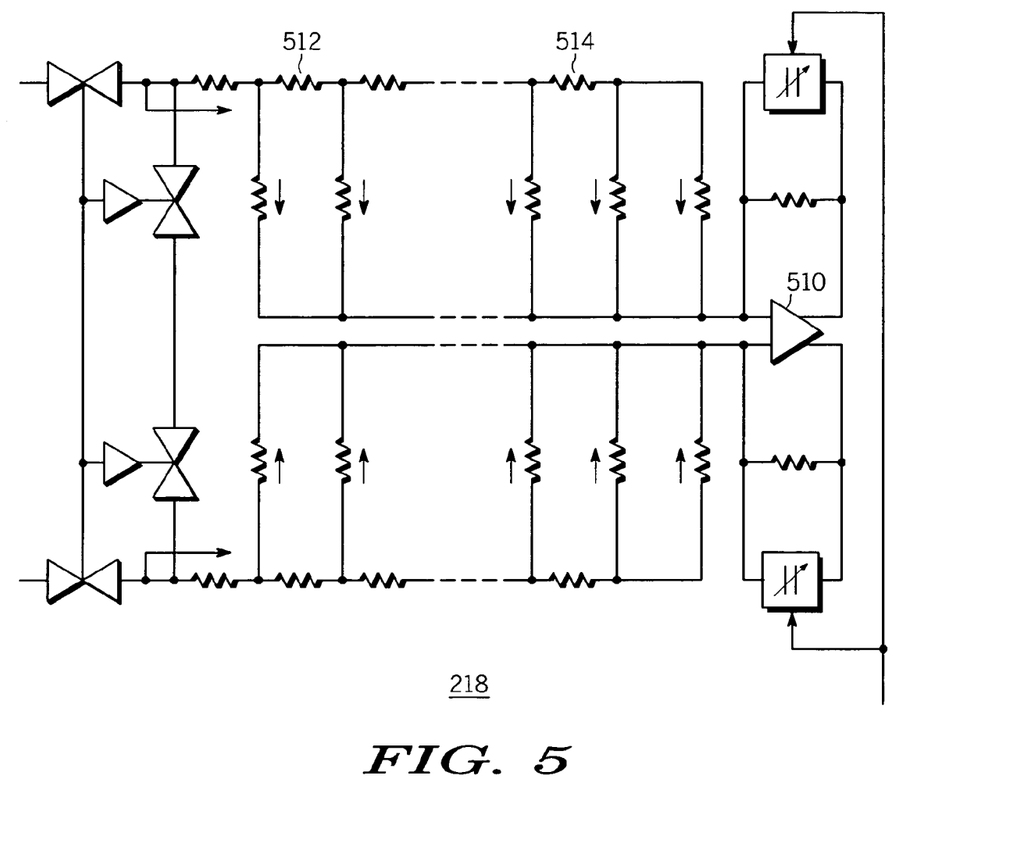
FIG. 5 is a circuit diagram of a post mixer amplifier of the single quadrature channel of FIG. 2 in accordance with a preferred embodiment of the present invention.

FIG. 5 shows the PMA 218 circuit topology in accordance with the preferred embodiment of the present invention. The PMA 218 circuit topology achieves a constant DC offset due to the PMA 218 stage alone across the PMA 218 gain control range. If the DC offset due to this PMA 218 stage varied significantly over the PMA 218 control range, additional warmup calibration steps 310, 312 would have been required for each PMA 218 gain setting. This is undesirable since there is a desire to minimize receiver warmup times to maximize battery life of the wireless device.

Gain control is achieved in this PMA 218 by steering current away from virtual ground of the operational amplifier 510 to differential virtual ground in 3 dB steps. The biggest contributor to DC offset is mismatch in input differential stage of the operational amplifier 510. Since the gain control is achieved through attenuation in front of the amplifier 510, the topology 512, 514 provides nearly constant DC offset over the whole AGC 226 range. When signal "DCOC" is logic 1, PMA 218 inputs are AC shorted and a common mode voltage is fed into the input of the PMA 218 to calculate static offset of the lineup over the AGC 226 range.

Figure 6:
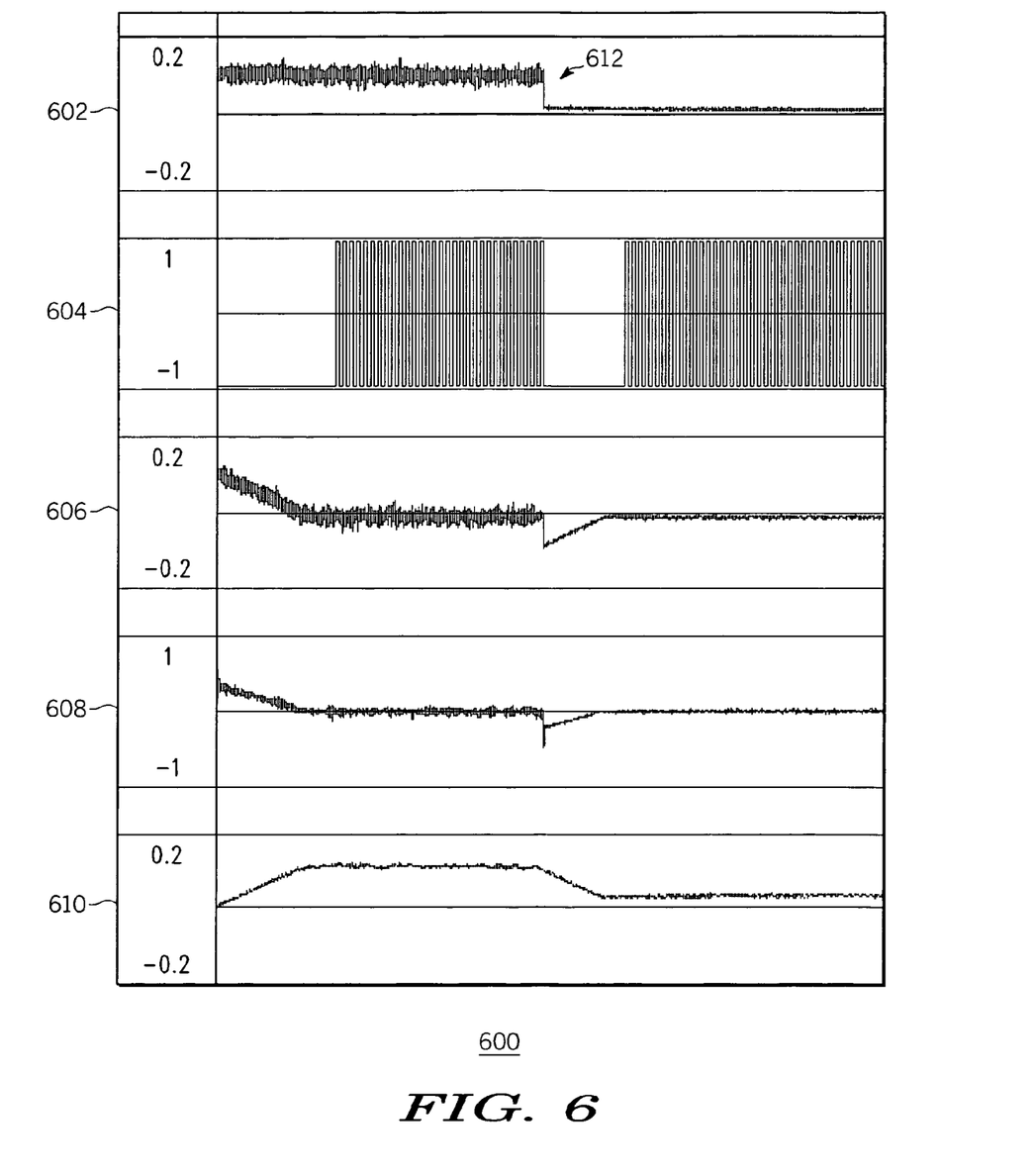
FIG. 6 are graphs of the signals passing through the RF circuitry of FIG. 2 with the DC offset correction loop responses without dynamic PMA gain change compensation.
Figure 7:
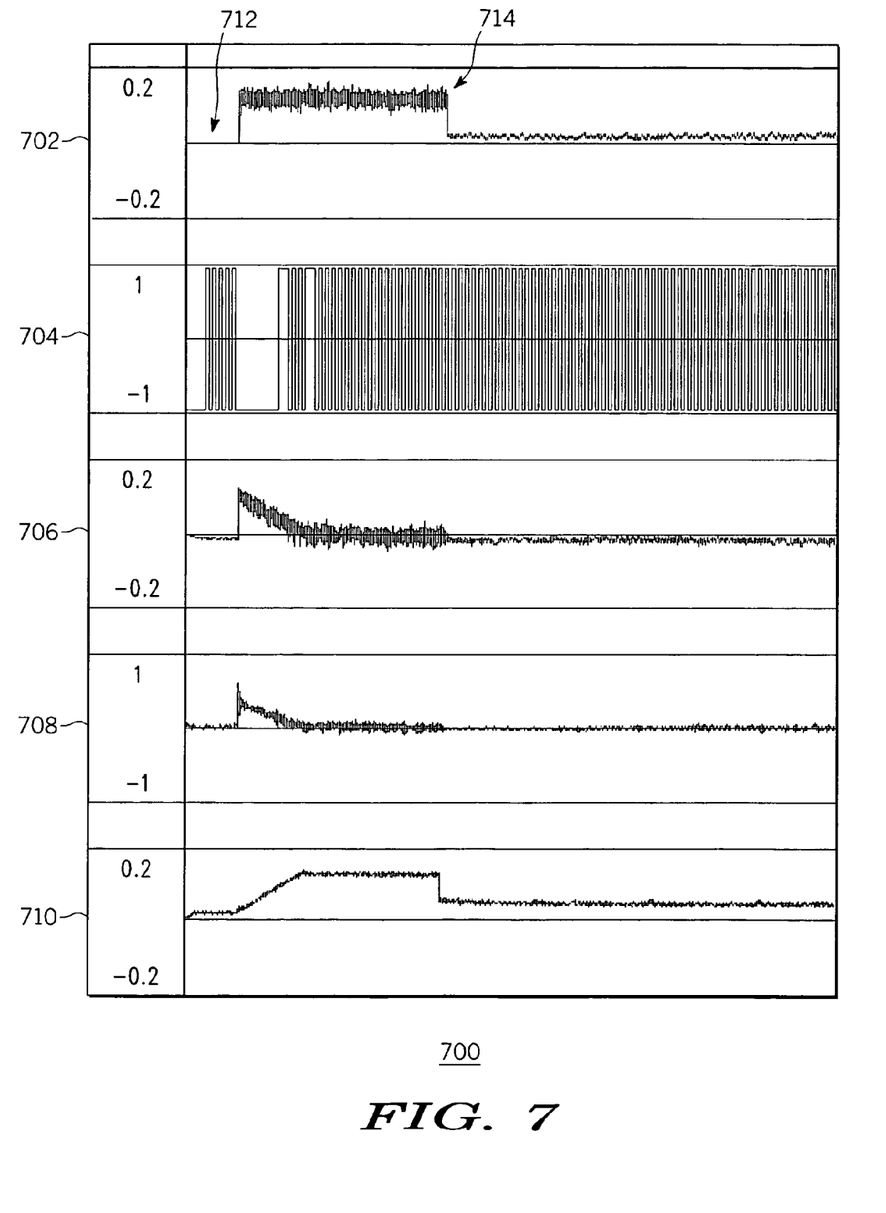
FIG. 7 are graphs of the signals passing through the RF circuitry of FIG. 2 with the DC offset correction loop responses with dynamic PMA gain change compensation.
Figure 8:
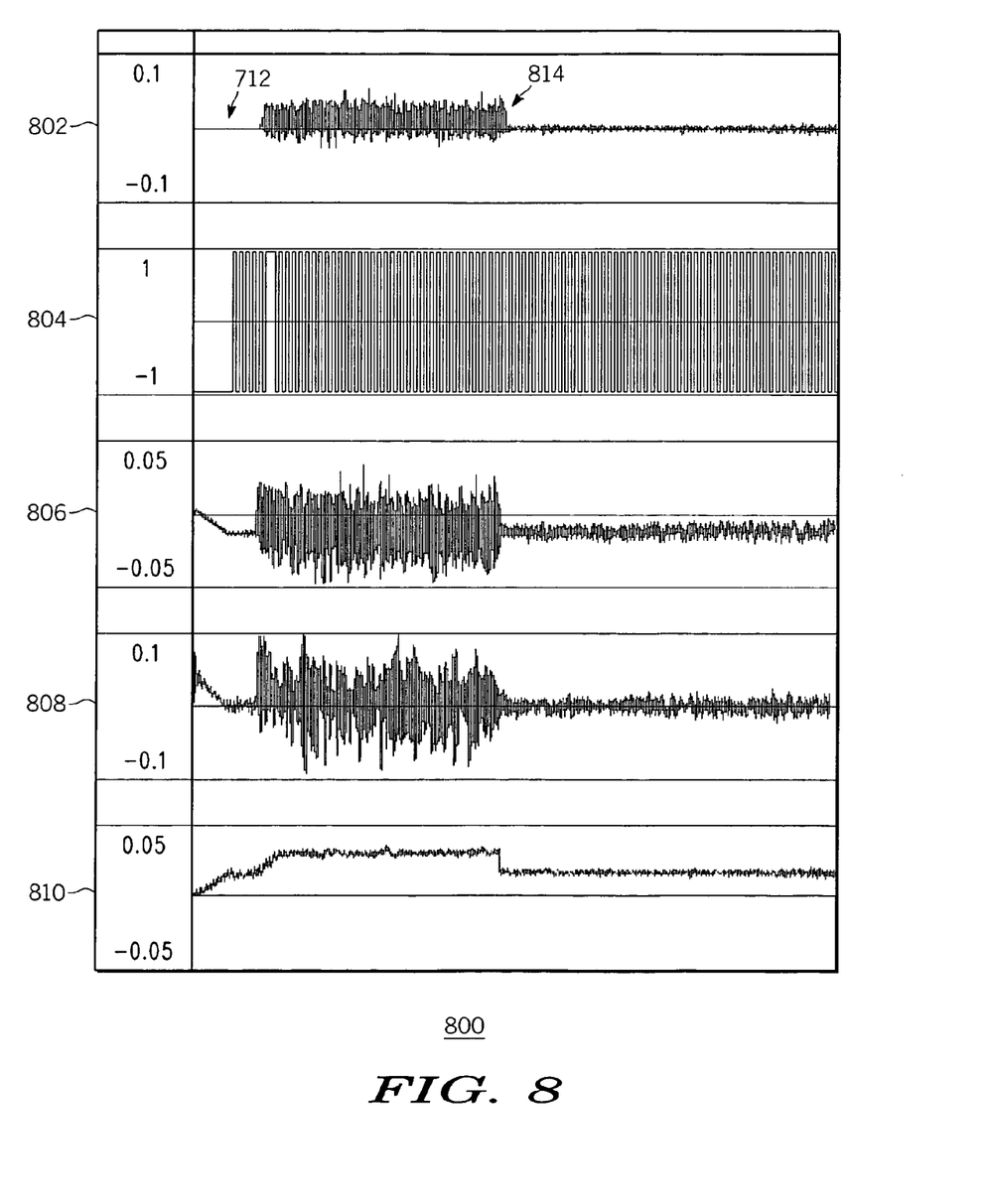
FIG. 8 are graphs of the signals passing through the RF circuitry of FIG. 2 with the DC offset correction loop responses with dynamic PMA gain change compensation for a situation where DC offsets due to IFA, BBF, Output Buffer, and DAC stages being more dominant.

The plots of FIGS. 6, 7 and 8 depict system simulation results for the DC offset correction system of the present invention. FIG. 6 shows an example 600 of a long transient lasting greater than 200 chips period (>pb 52 us) that can occur at the receiver A/D converter 222 if there is no dynamic compensation for PMA 218 gain changes. The output of the PMA 218 is shown in plot 602, the output from a 1-bit feedback comparator is shown in plot 604, the DC correction summer 440 output in plot 606, the receiver A/D converter 222 input in plot 608, and the digital offset correction D/A converter 232 output in plot 610. In 600, a PMA 218 gain change of sixteen dB is applied at time 612 to compensate for an LNA 212 gain change. Also, a high DC offset correction loop bandwidth attempts to minimize the DC transient as much as possible without going into a loop oscillatory condition. In plot 608 (signal at A/D input), it can be seen that at time 612 there is a significant DC transient (approximately 52 us duration) even with the loop running in a high bandwidth mode. This long acquisition transient can also be seen at time 612 in plot 608 (signal at receiver A/D converter 222) while reacting to the sixteen dB PMA gain change. Such a long DC transient degrades the receiver performance over the specified DC transient period.

FIGS. 7 and 8 depict 700, 800 using the specified gain compensation algorithm for offsets located only at the PMA 218 input to eliminate DC transients at the receiver A/D input 222, thereby highlighting the correction behavior of the two-step DC correction process of the present invention. Referring to FIG. 7, the output of the PMA 218 is shown in plot 702, the feedback comparator output is shown in plot 704, the DC correction subtractor 440 output in plot 706, the receiver A/D converter 222 input in plot 708, and the digital offset correction D/A converter 232 output in plot 710. Shorting of the PMA 218 input is depicted during time period 712 to calibrate out and store away offsets in the baseband path located after the PMA 218 in the $cal_{13}$ offset register 424 and, next in the warmup process 462, correcting out the additional offsets located in the receive path, such as LO 215 leakage and mixer 216 offsets (with the PMA 218 input connected to the mixer 216) can be seen in FIG. 7, particularly the second longer upward sloping line in plot 710. At time 714, the PMA 218 gain is reduced by sixteen dB to compensate for an LNA 212 state change. Also, the DC correction DAC output plot 710 shows how the DAC 232 output is instantaneously reduced by a particular amount at time 714 to compensate for only those offsets located at the PMA 218 input due to the specified PMA 218 gain change. As a result of this instantaneous open loop correction at the DC correction DAC 232 output, notice there is not a transient in the A/D 222 input plot 708 unlike what occurs in 600 (FIG. 6). This exemplifies the instantaneous correction behavior of the open loop correction algorithm of the present invention to eliminate such undesirable transients which can otherwise occur as a result of large PMA 218 gain changes.

The plot 800 of FIG. 8 shows how DC transients are avoided at the receiver A/D 222 input at time 814 even when the offsets located after the PMA 218 stage (e.g., IFA, IFF, biquads, output buffer, and DC correction DAC) are larger than those offsets located at the PMA 218 input. Similar to FIGS. 6 and 7, FIG. 8 includes the output of the PMA 218 shown in plot 802, the feedback comparator output shown in plot 804, the DC correction summer 440 output in plot 806, the receiver A/D converter 222 input in plot 808, and the digital offset correction D/A converter 232 output in plot 810.

Thus, the present invention includes a method for improved DC correction in radio frequency (RF) receiver circuitry having a warmup period and a receive path associated therewith, wherein the RF receiver circuitry includes a DC correction feedback path and a baseband path including at least one baseband analog gain control stage having a gain associated therewith. The at least one baseband analog stage may include at least one post mixer amplifier (PMA).

The method includes the step of performing a DC correction calculation operation during the warmup period to derive a DC correction value having a first component and a second component for each of the at least one gain control stage, wherein the step of performing a DC correction calculation operation during the warmup period includes the steps of: performing a first closed loop correction of the baseband path to derive a first component of the DC correction value and performing a second closed loop correction of the receive path as a function of the gain during the warmup period to derive a second component of the DC correction value. The method also includes the step of during operation of the RF receiver circuitry after the warmup period performing an open loop correction as a function of the gain and the DC correction value to perform instantaneous DC correction. In addition, the step of performing an open loop correction includes the steps of placing the DC correction feedback path in a hold mode and, in response to altering of the gain, performing an open loop correction as a function of the DC correction value.

In accordance with another embodiment of the present invention, the at least one baseband analog control stage includes an input and an output and the step of performing a first closed loop correction to derive a first component of the DC correction value includes the steps of connecting the input of the at least one baseband analog control stage to ground and storing a baseband path closed loop DC offset value as the first component of the DC correction value. The RF receiver circuitry additionally includes a pre-mixer RF lineup coupleable to the at least one baseband analog gain stage and having a high gain state and a low gain state and the at least one baseband analog gain stage having an input and an output. The step of performing a second closed loop correction as a function of the gain during the warmup period to derive a second component of the DC correction value includes the steps of coupling the pre-mixer RF lineup to the input of the at least one baseband analog gain stage, setting the gain of the at least one baseband analog gain stage to a high gain, setting the gain of the pre-mixer lineup to a low gain state, and storing the second closed loop DC offset value as the second component of the DC correction value.

The RF receiver circuitry may also include a Low Noise Amplifier (LNA) coupled to the at least one baseband analog control stage and having a high gain state and a low gain state, and the step of performing a first closed loop correction to derive a first component of the DC correction value would further include the step of placing the LNA in the low gain state before the step of storing a baseband path closed loop DC offset value. The RF receiver circuitry may additionally include a Low Noise Amplifier (LNA) coupled to the at least one baseband analog control stage and having a high gain state and a low gain state and at least one mixer coupled to the LNA, each of said at least one mixer having an input and an output, wherein the step of performing a second closed loop correction as a function of the gain during the warmup period to derive a second component of the DC correction value would include the steps of coupling the output of the at least one mixer to the input of the at least one baseband analog gain stage, setting the gain of the at least one baseband analog gain stage to a high gain, placing the LNA in the low gain state, and storing a receive path closed loop DC offset value as the second component of the DC correction value.

The step of storing the receive path closed loop DC offset value also includes the step of storing the receive path closed loop DC offset value to derive a stored DC correction value, wherein the stored DC correction value is a combination of the stored first component of the DC correction value and the receive path closed loop DC offset value which is the second component of the DC correction value. The method further includes the step of during operation of the RF receiver circuitry after the warmup period performing an open loop correction as a function of the gain and the stored DC correction value, wherein the step of performing an open loop correction may include the step of performing an open loop correction as a function of the gain, the stored DC correction value and a predetermined delay, wherein the predetermined delay corresponds to a time duration necessary to align altering of the gain to application of the DC correction value to the receive path.

The RF receiver circuitry further includes a DC correction feedback path and the step of performing an open loop correction includes the steps of placing the DC correction feedback path in a hold mode, enabling operation of the automatic gain control, and performing an open loop correction as a function of the gain and the stored DC correction value. The step of performing an open loop correction also includes the step of performing an open loop correction as a function of the stored DC correction value in response to altering of the gain.

The present invention is a radio frequency (RF) receiver circuitry having a warmup period associated therewith. The RF receiver circuitry includes at least one baseband analog gain control stage having a gain associated therewith, the at least one gain control stage having a first input for receiving a control signal to control the gain thereof, a second input and an output. Automatic gain control circuitry is coupled to the at least one gain control stage for generating and providing the control signal thereto and DC offset correction circuitry is coupled to the at least one gain control stage for receiving information therefrom. During the warmup period the second input of the at least one gain control stage is coupled to ground to perform a first closed loop correction to derive a first component of a DC correction value, the first component of the DC correction value being stored in the DC offset correction circuitry.

The RF receiver circuitry of Claim also includes a lowband oscillator (LO) and at least one mixer, each of the at least one mixer having an input coupled to the LO and an output coupleable to one of the at least one baseband analog gain control stage. During the warmup period the second input of each of the at least one gain control stage is coupled to one of the at least one mixer to perform a second closed loop correction as a function of the gain to derive a second component of the DC correction value. Also, during operation after the warmup period, the second input of each of the at least one gain control stage is coupled to one of the at least one mixer to perform an instantaneous open loop correction as a function of the gain and the DC correction value, wherein the DC correction value consists of a combination of the first component and the second component thereof. The RF receiver circuitry also includes two quadrature paths, an imaginary (I) path and a quadrature (Q) path, wherein each of the two quadrature paths comprise one of the at least one baseband analog gain control stage and one of the at least one mixer. The RF receiver circuitry further includes a Low Noise Amplifier (LNA) coupled to the at least one PMA and the automatic gain control circuitry, the LNA having a high gain state and a low gain state.

The DC offset correction circuitry includes storage means for storing the DC correction value and, when performing the second closed loop correction during the warmup period to derive the second component of the DC correction value, the automatic gain control circuitry signals the at least one gain control stage to set the at least one gain control stage to a high gain and signals the LNA to place it in the low gain state and a closed loop DC offset value is stored in the storage means as the second component of the DC correction value, combining with the first component to derive the DC correction value. The at least one gain control stage also includes at least one post mixer amplifier (PMA) having a PMA gain, wherein during the warmup period the second input of the at least one PMA is coupled to the at least one mixer to perform a second closed loop correction as a function of the gain to derive a second component of the DC correction value.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method in radio frequency (RF) receiver circuitry having a warmup period and a receive path associated therewith and including a baseband analog gain control stage having a gain and a baseband path associated therewith, the method comprising the step of:
   performing, within a feedback loop that includes a digital loop filter, a DC correction calculation operation during the warmup period to derive a DC correction value having a first component and a second component for the baseband analog gain control stage, wherein the step of performing a DC correction calculation operation during the warmup period comprises the steps of:
      causing an input to the baseband analog gain control stage to be grounded;
      performing a first closed loop correction of the baseband path to derive the first component of the DC correction value, wherein the first component of the DC correction value is a first DC offset value located at an output of the digital loop filter while the input is grounded;
      causing the input of the baseband analog gain control stage to be connected to a mixer; and
      performing a second closed loop correction of the receive path as a function of the gain during the warmup period to derive the second component of the DC correction value, wherein the second component of the DC correction value is a second DC offset value located at the output of the digital loop filter while the input is connected to the mixer.

2. The method of claim 1 further comprising the step of during operation of the RF receiver circuitry after the warmup period performing an open loop correction as a function of the gain and the DC correction value to perform instantaneous DC correction.

3. The method of claim 2 wherein the RF receiver circuitry further comprises a DC correction feedback path, and wherein the step of performing an open loop correction comprises the steps of:
   placing the DC correction feedback path in a hold mode; and
   in response to altering of the gain, performing an open loop correction as a function of the DC correction value.

4. The method of claim 1, wherein the RF receiver circuitry further comprises a Low Noise Amplifier (LNA) coupled to the baseband analog control stage and having a high gain state and a low gain state, and wherein the step of performing a first closed loop correction to derive a first component of the DC correction value further comprises the step of placing the LNA in the low gain state before the step of deriving the first component of the DC correction value.

5. The method of claim 1, wherein the RF receiver circuitry further comprises a Low Noise Amplifier (LNA) coupled to the baseband analog control stage and having a high gain state and a low gain state and the mixer coupled to the LNA, the mixer having an input and an output, and wherein the step of performing a second closed loop correction as a function of the gain during the warmup period to derive a second component of the DC correction value comprises the steps of:
   setting the gain of the baseband analog gain stage to a high gain;
   placing the LNA in the low gain state; and
   storing the second DC offset value as the second component of the DC correction value.

6. The method of claim 5 wherein the step of storing the second DC offset value comprises the step of storing the second DC offset value to derive a stored DC correction value, wherein the stored DC correction value is a combination of the stored first component of the DC correction value and the second DC offset value which is the second component of the DC correction value.

7. The method of claim 6 further comprising the step of during operation of the RF receiver circuitry after the warmup period performing an open loop correction as a function of the gain and the stored DC correction value.

8. The method of claim 7 wherein the RF receiver circuitry further comprises a DC correction feedback path, and wherein the step of performing an open loop correction comprises the step of:
 placing the DC correction feedback path in a hold mode;
 enabling operation of the automatic gain control; and
 performing an open loop correction as a function of the gain and the stored DC correction value.

9. The method of claim 8 wherein the step of performing an open loop correction comprises the step of performing an open loop correction as a function of the stored DC correction value in response to altering of the gain.

10. The method of claim 7 wherein the step of performing an open loop correction comprises the step of performing an open loop correction as a function of the gain, the stored DC correction value and a predetermined delay, wherein the predetermined delay corresponds to a time duration necessary to align altering of the gain to application of the DC correction value to the receive path.

11. The method of claim 1 wherein the RF receiver circuitry further comprises a pre-mixer RF lineup coupleable to the baseband analog gain stage and having a high gain state and a low gain state, the baseband analog gain stage having an input and an output, wherein the step of performing a second closed loop correction as a function of the gain during the warmup period to derive a second component of the DC correction value comprises the steps of:
 coupling the pre-mixer RF lineup to the input of the at least one baseband analog gain stage;
 setting the gain of the at least one baseband analog gain stage to a high gain;
 setting the gain of the pre-mixer lineup to a low gain state; and
 storing the second DC offset value as the second component of the DC correction value.

12. The method of claim 1 wherein the at least one baseband analog stage comprises at least one post mixer amplifier (PMA).

13. Radio frequency (RF) receiver circuitry having a warmup period associated therewith, the RF receiver circuitry comprising:
 a baseband analog gain control stage having a gain associated therewith, the baseband analog gain control stage having a first input for receiving a control signal to control the gain thereof, the baseband analog gain control stage further having a second input and an output;
 automatic gain control circuitry coupled to the baseband analog gain control stage for generating and providing the control signal thereto;
 a lowband oscillator (LO);
 a mixer having an input coupled to the LO and an output coupleable to the baseband analog gain control stage; and
 DC offset correction circuitry that includes a digital loop filter, and that is coupled to the baseband analog gain control stage for receiving information therefrom and coupled to the baseband analog gain control stage and the mixer for control thereof during the warmup period, wherein during the warmup period the DC offset correction circuitry couples the second input of the baseband analog gain control stage to ground to perform a first closed loop correction to derive a first component of a DC correction value, wherein the first component of the DC correction value is a first DC offset value located at an output of the digital loop filter while the second input is grounded, the first component of the DC correction value being stored in the DC offset correction circuitry and couples the second input of the baseband analog gain control stage to the mixer to perform a second closed loop correction as a function of the gain to derive a second component of the DC correction value, wherein the second component of the DC correction value is a second DC offset value located at the output of the digital loop filter while the input is connected to the mixer.

14. The RF receiver circuitry of claim 13 wherein during operation after the warmup period, the second input of each of the at least one gain control stage is coupled to one of the at least one mixer to perform an instantaneous open loop correction as a function of the gain and the DC correction value, wherein the DC correction value consists of a combination of the first component and the second component thereof.

15. The RF receiver circuitry of claim 14 comprising two quadrature paths, an imaginary (I) path and a quadrature (Q) path, wherein each of the two quadrature paths comprise one of the at least one baseband analog gain control stage and one of the at least one mixer.

16. The RF receiver circuitry of claim 13 further comprising a Low Noise Amplifier (LNA) coupled to the at least one PMA and the automatic gain control circuitry, the LNA having a high gain state and a low gain state, and wherein the DC offset correction circuitry includes storage means for storing the DC correction value, wherein when performing the second closed loop correction during the warmup period to derive the second component of the DC correction value, the automatic gain control circuitry signals the at least one gain control stage to set the at least one gain control stage to a high gain and signals the LNA to place it in the low gain state and a closed loop DC offset value is stored in the storage means as the second component of the DC correction value, combining with the first component to derive the DC correction value.

17. The RF receiver circuitry of claim 13 wherein the at least one gain control stage comprises at least one post mixer amplifier (PMA) having a PMA gain.

* * * * *